(12) United States Patent
Gohr

(10) Patent No.: US 6,590,494 B2
(45) Date of Patent: Jul. 8, 2003

(54) ELECTRONIC DEVICE

(75) Inventor: Andreas Gohr, Ravensburg (DE)

(73) Assignee: i f m electronic GmbH, Essen (DE)

( * ) Notice: Subject to any disclaimer, the term of this patent is extended or adjusted under 35 U.S.C. 154(b) by 45 days.

(21) Appl. No.: 09/801,921

(22) Filed: Mar. 9, 2001

(65) Prior Publication Data

US 2001/0027059 A1 Oct. 4, 2001

(30) Foreign Application Priority Data

Mar. 9, 2000 (DE) .......................................... 100 11 127

(51) Int. Cl.$^7$ .............................................. H04N 11/04
(52) U.S. Cl. ........................... 340/310.01; 340/310.07; 340/310.08
(58) Field of Search .................. 340/310.01, 310.07, 340/310.08, 538; 235/449

(56) References Cited

U.S. PATENT DOCUMENTS 5,909,024 A * 6/1999 Voorman et al. ............ 235/449

FOREIGN PATENT DOCUMENTS

DE 196 39 379 2/1998

OTHER PUBLICATIONS

Asi The Actuator–sensor Interface for Automation, Prof. Dr. W. Kriesel et al., 1994 in Carl Hanser Verlag, Münich and Vienna, and the $2^{nd}$ revised and expanded edition of this book published in 1999.

* cited by examiner

Primary Examiner—Julie Lieu
(74) Attorney, Agent, or Firm—Nixon Peabody LLP; David S. Safran

(57) ABSTRACT

An electronic device serving as a connecting component between a power supply and data transmission system and at least one of an actuator and sensor, and including a two-pole system and device terminal, a two-pole power supply output, a data processor controller electrically connected to the system and device terminal, and at least one choke for data separation or decoupling between the system and device terminal and the power supply output. The electronic device has expanded applications, such as an expanded address range and high current load capacity by electrically connecting an isolation amplifier circuit effective only for AC voltage parallel to the at least one choke.

8 Claims, 2 Drawing Sheets

ELECTRONIC DEVICE

BACKGROUND OF THE INVENTION

1. Field of the Invention

The invention relates to an electronic device for electrically connecting a power supply and data transmission system and at least one actuator and/or sensor, including a two-pole system and device terminal, a two-pole power supply output, and having data separation or decoupling between the two-pole system, the device terminal and the power supply output. The device further includes a data processor electrically connected to the two-pole system and the device terminal, and including at least one choke as data separation or decoupling between the two-pole system, the device terminal and the power supply output. The invention relates to a hardware component of the system under discussion, specifically to the electronic device which is called the slave (or ASI slave) in this system.

2. Description of the Prior Art

Under the name "actuator-sensor interface or "ASI" eleven well-known actuator, sensor and control manufacturers and two institutions of higher education have developed a system of hardware components which are connected via three interfaces among one another and with their environment (See, *ASI The Actuator-Sensor Interface for Automation*, by Prof. Dr. W. Kriesel and Dr. O. W. Madelung, published in 1994 in Carl Hanser Verlag, Munich and Vienna, and the 2nd revised and expanded edition of this book published in 1999). The hardware components of this system include a transmission system, slaves and at least one master. In the system under discussion, the transmission system, also called the ASI line, is used for power supply of the slave (and thus, the actuators and sensors connected to the slaves) and for power supply of the master and for data transmission between the slaves among one another and between the slaves and the master.

The electronic device is called the slave (or ASI slave), and represents the connecting component between a power supply and data transmission system and an plurality of actuators and sensors. The electronic device may take the form of a separate device which is connected to the power supply and data transmission system and to which at least one of the actuators and the sensors are connected. In terms of hardware engineering, however, it can also be such that a slave, an actuator and a sensor, or a slave, at least one of a plurality of actuators and several sensors are combined to form the electronic device. The electronic device includes a two-pole system and device terminal with which the power supply and data transmission system are connected to the electronic device and the electronic device to the power supply and transmission system, a power supply output for power supply to the actuators and/or sensors, in the indicated citation called $U_{out}$ and 0 V, data separation and decoupling between the system and device terminal and the power supply output thereto, which separates the power path and the data path from one another.

The power supply or part of the power supply, data processing electronics connected to the system and device terminal, which includes a transmitter, a receiver, a sequence control system and a nonvolatile memory, and a multi-pole data input and output which is connected to the data processing electronics. The slaves and the master are designed such that data is generated and exchanged in the form of a data telegram via the power supply and data transmission system. This results in the fact that the slaves should take only a limited current from the power supply and data transmission system, and the impedance behavior of the slaves over frequency should not fall below a boundary curve. In the such a system, the slaves consist of a highly integrated circuit and a few external components. A power supply voltage between 19 V and 25.6 V at a maximum current of 35 mA is made available, which is sufficient for some actuators and for most of the sensors. If greater currents are necessary, a parallel branch is set up which makes available the increased current. Data separation or decoupling is accomplished by chokes which are electronically simulated in the integrated circuit or when higher currents are necessary, by chokes as external components.

The conventional electronic device of the prior art, therefore, the slaves (ASI slaves), have limited applicability in two respects. Firstly, the actuators and sensors to be connected should not have an impedance such that the impedance behavior over frequency falls below the stipulated boundary curve. Secondly, the possible power supply, whether voltage or current, is insufficient or at least problematical, especially for certain actuators. The limited applicability of the slaves becomes relevant especially when solenoid valves are to be connected as actuators.

It has been formulated to enhance the capability of conventional electronic devices, in particular, the slave for connecting a controllable, additional impedance in series to one pole of a power supply output. This makes it possible to connect to the electronic device and those actuators which must not be connected to conventional electronic devices, therefore, to the slaves described in the prior art, because due to such a connection, the impedance behavior of the device over frequency would fall below the stipulated boundary curve so that data transmission would no longer work properly. With respect to the details of the aforementioned teaching "series connection of a controllable additional impedance", reference is made to German Patent Publication 196 39 379.

In conventional electronic devices, a current of 0.2A can be taken from the power supply and transmission system. There are two chokes in these devices as data separation and decoupling and the chokes, of which each has an inductance of approximately 5 mH, a resistance of approximately 5 ohms and a resonant frequency which is greater than 500 kHz, are in series and in series to the connected load when the load is connected to the power supply output. The electronic devices described above with respect to their data separation and decoupling are problematical in two completely different respects. Firstly, in current ASI systems thirty one electronic devices (slaves) can be connected to the power supply and data transmission system. ASI systems with an expanded address range are used so that instead of thirty one slaves, sixty two can be connected. This, of course, leads to the requirement that the minimum impedance of the individual slaves must be doubled. Secondly, the electronic devices allow a current of only, 0.2A, however, it is desirable to allow a higher current such as 0.4A to 0.6A. The two problems could be satisfied by increasing the number of chokes used for data separation and decoupling, thereby, doubling the minimum impedance by connecting each choke in series to another choke of the same design. However, this would lead to doubling of the resistance, and thus, to doubling of the heat loss or power loss which has taken place in the electronic devices, thereby resulting in an undesirable increase in temperature of the electronic device.

If the intention is to build devices which allow a current of 0.4A, a total of eight chokes are necessary, in each branch two chokes in series, to which two other chokes at a time must be connected. In building devices which allow a current of 0.6A, eighteen chokes are necessary. (In the aforementioned it has been considered that the current which flows via the choke, when economical standard chokes are to be used, may not exceed a value of roughly 0.2A). If the above described measures were used cumulatively in the described manner, if both the address range were to be expanded and also the current load capacity were to be increased, sixteen chokes (for a current of 0.4A) or even thirty six chokes (for a current of 0.6A) would have to be installed, which would lead to devices which would be too expensive, too large and too hot.

SUMMARY OF THE INVENTION

In view of the foregoing, an object of the present invention is to provide an electronic device with expanded applications such that an expanded address range and a higher current load capacity will be possible.

The electronic device in accordance with the present invention, the aforementioned object is characterized in that an isolation amplifier circuit which is effective only for AC voltage is connected in parallel to the choke. The electronic device in accordance with the present invention is data separation and decoupling, whereby preferably at least one choke is data separation and decoupling. Regarding the function of data separation and decoupling, the component "data separation or decoupling" is one which should have a relatively great alternating current impedance, but a relatively small direct current resistance for the frequency range under consideration. While, one such component with the corresponding dimensioning is a choke, other components are also conceivable which have a relatively large alternating current impedance and a relatively small direct current resistance. Accordingly, with respect to the electronic device in accordance with the present invention, this means that parallel to the choke an isolation amplifier circuit which is effective only for AC voltage is connected, thereby requiring no need for at least one choke as data separation or decoupling. Rather, for explanation, the expression "choke" is only being used because such a devise is apparent to one skilled in the art.

As previously stated, the electronic device in accordance with the present invention is characterized essentially in that an isolation amplifier circuit which is effective only for AC voltage is connected parallel to the choke. An isolation amplifier circuit which is effective only for AC voltage means any component or any circuit to which it applies that the output side AC voltage "follows" the input-side AC voltage. An isolation amplifier circuit of the type under consideration is, therefore, always present when there is very little or no AC voltage between the output of the isolation amplifier circuit and the input of the isolation amplifier circuit. An important aspect of the present invention is to electrically connect an isolation amplifier circuit which is effective only for AC voltage parallel to the choke, generally parallel to the data separation or decoupling. This leads to the fact that either only very little or no alternating current flows via the choke, generally via the data separation or decoupling. The parallel connection of the choke and the isolation amplifier circuit which is effective only for AC voltage is, therefore, a component which has a large alternating current impedance, but a small direct current resistance. In particular, there are now various possibilities for embodying and developing the electronic device in accordance with the present invention.

DETAILED DESCRIPTION OF THE INVENTION

The electronic device in accordance with the present invention is part of a system which includes a transmission system, slaves and at least one master. The invention relates to an electronic device in which the system under discussion is called a slave (or ASI slave). In such a system, the transmission system, also known as an ASI line, is used on the one hand to supply power to the slaves (and thus, the actuators and/or sensors connected to the slaves) and to the master, and also to transmit data between the slaves and between the slaves and the master. Consequently, within the of the invention the transmission system involved here is called the power supply and data transmission system.

The electronic device in accordance with the present invention serves as a component which electrically connects the power supply and data transmission system (not shown) and the plurality of actuators and/or sensors. The electronic device includes a two-pole system and device terminal 1 with which the power supply and data transmission system is connected, a power supply output 2 for supplying the plurality of actuators or sensors with electric power, at least one of data separation and decoupling between the system and device terminal 1 and the power supply output 2, which separates the power path and the data path from one another. Moreover a data processing controller 3 is connected to the system and device terminal 1, and a multi-pole data input and output (not shown) is connected to the data processing controller 3.

Figure 1:
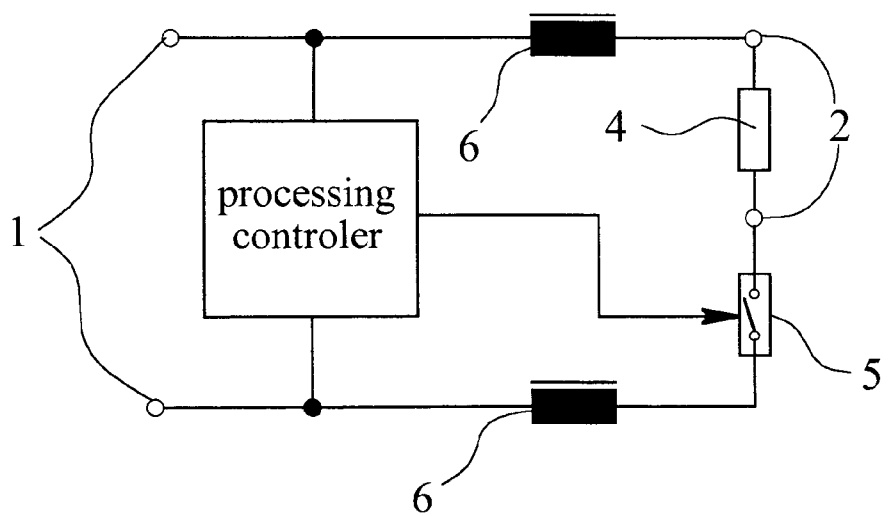
FIG. 1 shows a circuit diagram of a prior art electronic device.

FIG. 1 shows that a load 4 such as a plurality of actuators and/or sensors, is connected to the power supply output 2 and a data processing controller 3 which triggers an switch 5. One such switch triggered by the data processing controller 3, of course, generally an electronic switch 5, is necessary when the load 4 is an actuator. This switch is also applicable in the embodiments of the electronic devices in accordance with the present invention shown in FIGS. 2, 4 and 5 and including two chokes 6 for data separation and decoupling, each of the chokes 6 having an inductance of approximately 5 mH, a resistance of approximately 5 ohms, and a resonant frequency which is greater than 500 kHz. As has already been stated above, in current ASI systems thirty one electronic devices of the type under consideration here can be connected to the power supply and data transmission system and the known electronic devices of the type under consideration here allow a current of 0.2A.

Figure 2:
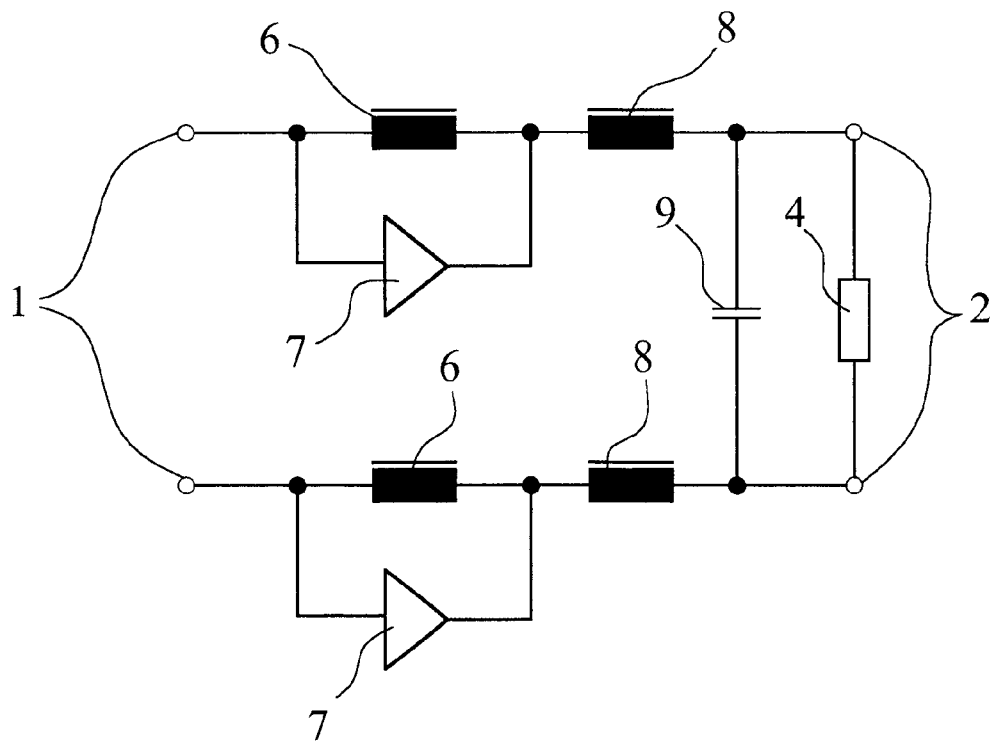
FIG. 2 shows a circuit diagram of a first embodiment of an electronic device in accordance with the present invention whereby one isolation amplifier circuit which is effective only for AC voltage at a time is connected in parallel to the chokes which are being used for at least one of data separation and decoupling.
Figure 4:
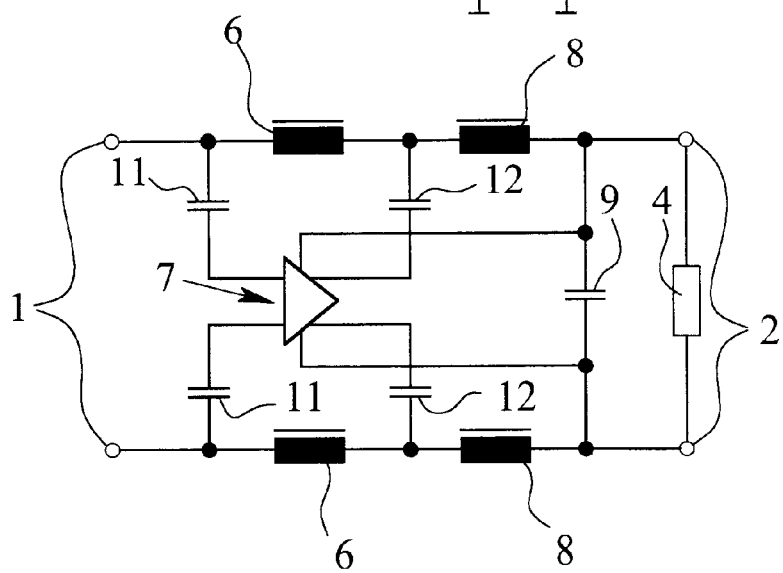
FIG. 4 shows a circuit diagram of a second embodiment of an electronic device in accordance with the present invention.
Figure 5:
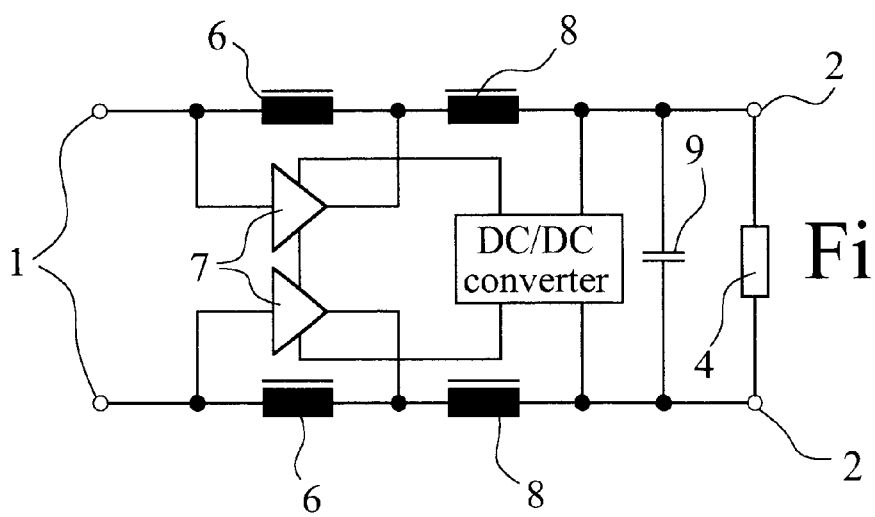
FIG. 5 shows a circuit diagram of a third embodiment of an electronic device in accordance with the present invention.

In the embodiments shown in FIGS. 2, 4 and 5, an isolation amplifier circuit 7 which is effective only for AC voltage is electrically connected parallel to the chokes 6. Any component or any circuit is suitable for this purpose to which it applies that the output-side AC voltage "follows" the input-side AC voltage. The isolation amplifier circuit 7, therefore, leads to the fact there is very little or no AC voltage between the output of the isolation amplifier circuit 7 and the output of the corresponding choke 6, as well as the input of the isolation amplifier circuit 7 and the input of the corresponding choke 6. This leads to either very little or no alternating current flow. The parallel connection between the chokes 6 and the isolation amplifier circuits 7 which is effective only for AC voltage at a time is, therefore, a component which has large alternating current impedance but small direct current resistance.

Figure 3:
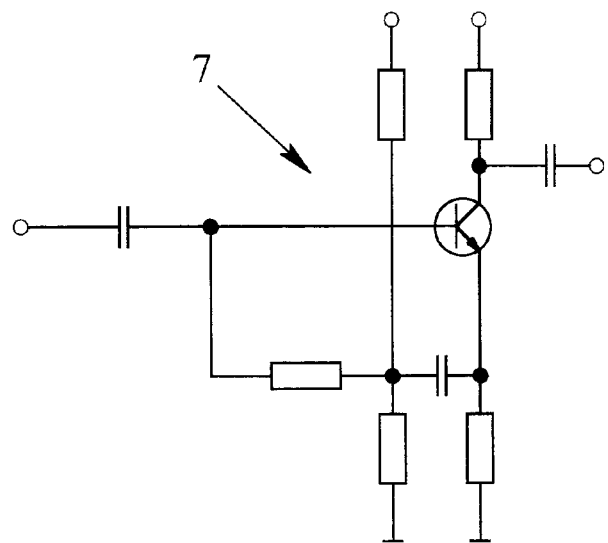
FIG. 3 shows a circuit diagram of an isolation amplifier circuit for an electronic device in accordance with the present invention.

Moreover, the data processing controller 3 and the switch 5 described in the electronic device of the first embodiment is applicable in the embodiments shown in FIGS. 2, 4 and 5. In the embodiment shown in FIG. 2, while the isolation amplifier circuit 7 can be made as an AC voltage amplifier with a gain of 1, the isolation amplifier circuit 7 can also be made as a bootstrap circuit, as shown in FIG. 3. Since bootstrap circuits are considered prior art, a separate description of the bootstrap circuit shown in FIG. 3 as the isolation amplifier circuit 7 will be omitted. Moreover, a stabilization choke 8 is electrically connected in series respectively to the parallel connection of the chokes 6 and isolation amplifier circuits 7. The working point of the isolation amplifier circuits 7 can be stabilized by the stabilization chokes 8. The stabilization chokes 8 prevent a high frequency short circuit via a smoothing capacitor 9 which is parallel to the power supply output 2.

Since the electronic devices in accordance with the present invention are serviceable without a special external voltage supply, it applies to each embodiment that a power supply voltage for the isolation amplifier circuits 7 is obtained within the electronic device. In the embodiments shown in FIGS. 4 and 5, a DC voltage at the power supply output 2 is used as the power supply voltage for the isolation amplifier circuits 7. In the embodiment shown in FIG. 4, the DC voltage at the power supply output 2 is directly the power supply voltage for the isolation amplifier circuits 7 which are combined in an AC voltage amplifier. Conversely, in the embodiment shown in FIG. 5, the power supply voltage for the isolation amplifier circuits 7 is obtained via a DC/DC converter 10 from the DC voltage at the power supply output 2 whereby the DC/DC converter 10 provides for the DC voltage at the power supply output 2 to be transformed to a higher value, for example, from 15V to 17V.

Finally, FIG. 4 shows a preferred embodiment of an electronic device in accordance with the present invention whereby the isolation amplifier circuits 7 are each connected on the input side and the output side via coupling capacitors 11, 12 to the chokes 6. While in the electronic devices of the type under consideration which are known in the prior art the chokes 6 have an inductance of approximately 5 mH and a resistance of approximately 5 ohms, in the electronic devices in accordance with the present invention the chokes 6 can be used which only have an inductance of approximately 0.1 mH and a resistance of only roughly 2 mOhms. The chokes 6 can, therefore, be made smaller by a factor of 2 to 5 and the losses are reduced by a factor of 4 to 25.

What is claimed is:

1. An electronic device for connecting a power supply and data transmission system and at least one of a plurality of actuators and a plurality of sensors, said electronic device comprising:

a two-pole system and device terminal adapted to be coupled to said power supply and data transmission system;

a two-pole power supply output adapted to be coupled to said at least one of said plurality of actuators and said plurality of sensors;

a data processing controller electrically connected to said two-pole system and device terminal; and at least one choke which serves as a data separator or decoupler between said two-pole system and device terminal and said two-pole power supply output, wherein an isolation amplifier circuit effective for AC voltage is electrically connected parallel to said at least one choke.

2. The electronic device as claimed in claim 1, wherein said isolation amplifier circuit is an AC voltage amplifier having a gain of 1.

3. The electronic device as claimed in claim 2, wherein said isolation amplifier circuit is a bootstrap circuit.

4. An electronic device for connecting a power supply and data transmission system and at least one of a plurality of actuators and a plurality of sensors, said electronic device comprising:

a two-pole system and device terminal;

a two-pole power supply output;

a data processing controller electrically connected to said two-pole system and device terminal;

at least one choke which serves as a data separator or decoupler between said two-pole system and device terminal and said two-pole power supply output, wherein an isolation amplifier circuit effective for AC voltage is electrically connected parallel to said at least one choke; and a stabilization choke electrically connected in series to said at least one choke and said isolation amplifier circuit.

5. The electronic device as claimed in claim 4, wherein a power supply voltage for said isolation amplifier circuit is obtained within said electronic device.

6. The electronic device as claimed in claim 5, wherein a DC voltage at said power supply output is used as the power supply voltage for said isolation amplifier circuit.

7. The electronic device as claimed in claim 5, wherein the power supply voltage for said isolation amplifier circuit is obtained via a DC/DC converter from the DC voltage at said power supply output.

8. The electronic device as claimed in claim 7, wherein said isolation amplifier circuit is electrically connected on at least one of an input side and an output side via at least one coupling capacitor to said at least one chokes.

* * * * *